(12) United States Patent
Bower et al.

(10) Patent No.: US 9,716,082 B2
(45) Date of Patent: Jul. 25, 2017

(54) MICRO ASSEMBLED HYBRID DISPLAYS AND LIGHTING ELEMENTS

(71) Applicant: X-Celeprint Limited, Cork (IE)

(72) Inventors: Christopher Bower, Raleigh, NC (US); Matthew Meitl, Durham, NC (US); Julian Carter, Cambridge (GB); Ronald S. Cok, Rochester, NY (US)

(73) Assignee: X-Celeprint Limited, Lee Maltings, Dyke Parade, Cork (IE)

( * ) Notice: Subject to any disclaimer, the term of this patent is extended or adjusted under 35 U.S.C. 154(b) by 71 days.

(21) Appl. No.: 14/836,168

(22) Filed: Aug. 26, 2015

(65) Prior Publication Data

US 2016/0064363 A1 Mar. 3, 2016

Related U.S. Application Data

(60) Provisional application No. 62/042,093, filed on Aug. 26, 2014.

(51) Int. Cl.
*H01L 33/32* (2010.01)
*H01L 25/16* (2006.01)
(Continued)

(52) U.S. Cl.
CPC ........ *H01L 25/167* (2013.01); *H01L 25/0753* (2013.01); *H01L 27/3225* (2013.01);
(Continued)

(58) Field of Classification Search
None
See application file for complete search history.

(56) References Cited

U.S. PATENT DOCUMENTS 5,550,066 A 8/1996 Tang et al.
5,621,555 A 4/1997 Park
(Continued)

FOREIGN PATENT DOCUMENTS

WO WO-2006/027730 A1 3/2006
WO WO-2006/099741 A1 9/2006
(Continued)

OTHER PUBLICATIONS

U.S. Appl. No. 14/822,868, Bower et al.
(Continued)

*Primary Examiner* — Michael Lebentritt
(74) *Attorney, Agent, or Firm* — Choate, Hall & Stewart LLP; William R. Haulbrook; Alexander D. Augst

(57) ABSTRACT

The disclosed technology relates generally hybrid displays with pixels that include both inorganic light emitting diodes (ILEDs) and organic light emitting diodes (OLEDs). The disclosed technology provides a hybrid display that uses a mixture of ILEDs and OLEDs in each pixel. In certain embodiments, each pixel in the hybrid display includes a red ILED, a blue ILED, and a green OLED. In this instance, the OLED process would not require a high resolution shadow mask, thereby enhancing the manufacturability of OLEDs for larger format displays. Additionally, the OLED process in this example would not require any fine lithography. The OLED subpixel (e.g., green subpixel) can be larger and the ILEDs can be small (e.g., micro-red and micro-blue ILEDs). The use of small ILEDs allows for other functions to be added to the pixel, such as micro sensors and micro integrated circuits.

19 Claims, 3 Drawing Sheets

(51) Int. Cl.
*H01L 25/075* (2006.01)
*H05B 33/08* (2006.01)
*H01L 27/32* (2006.01)

(52) U.S. Cl.
CPC ..... *H05B 33/0845* (2013.01); *H05B 33/0896* (2013.01); *H01L 27/3216* (2013.01); *H01L 27/3244* (2013.01); *H01L 2924/0002* (2013.01)

(56) References Cited

U.S. PATENT DOCUMENTS

| | | |
|---|---|---|
| 5,815,303 A | 9/1998 | Berlin |
| 5,994,722 A | 11/1999 | Averbeck et al. |
| 6,084,579 A | 7/2000 | Hirano |
| 6,087,680 A | 7/2000 | Gramann et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,577,367 B2 | 6/2003 | Kim |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,129,457 B2 | 10/2006 | McElroy et al. |
| 7,195,733 B2 | 3/2007 | Rogers et al. |
| 7,288,753 B2 | 10/2007 | Cok |
| 7,402,951 B2 | 7/2008 | Cok |
| 7,417,648 B2 * | 8/2008 | Credelle ............ G02F 1/133514 345/690 |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,622,367 B1 | 11/2009 | Nuzzo et al. |
| 7,629,955 B2 * | 12/2009 | Asao .................. G09G 3/3614 345/79 |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 * | 1/2011 | Kimura ............. G02F 1/136286 349/114 |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 * | 5/2011 | Cok .................. H01L 27/3213 313/483 |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,619,011 B2 * | 12/2013 | Kimura ............... G02F 1/13624 345/90 |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,836,624 B2 * | 9/2014 | Roberts ................ G09G 3/3413 345/102 |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,912,020 B2 * | 12/2014 | Bedell .................. H01L 27/156 257/E33.025 |
| 8,946,760 B2 | 2/2015 | Kim |
| 8,987,765 B2 | 3/2015 | Bibl et al. |
| 9,048,449 B2 * | 6/2015 | Kim ..................... H01L 51/52 |
| 9,105,813 B1 | 8/2015 | Chang |
| 9,178,123 B2 | 11/2015 | Sakariya et al. |
| 9,202,996 B2 | 12/2015 | Orsley et al. |
| 9,308,649 B2 | 4/2016 | Golda et al. |
| 9,343,042 B2 * | 5/2016 | Miller .................. G09G 3/2003 |
| 9,412,977 B2 * | 8/2016 | Rohatgi ............. H01L 51/5253 |
| 9,437,782 B2 * | 9/2016 | Bower .................... G09G 3/32 |
| 9,444,015 B2 | 9/2016 | Bower et al. |
| 2001/0022564 A1 | 9/2001 | Youngquist et al. |
| 2002/0096994 A1 | 7/2002 | Iwafuchi et al. |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0264472 A1 | 12/2005 | Rast |
| 2005/0275615 A1 | 12/2005 | Kahen et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2008/0211734 A1 | 9/2008 | Huitema et al. |
| 2009/0278142 A1 | 11/2009 | Watanabe et al. |
| 2009/0315054 A1 | 12/2009 | Kim et al. |
| 2010/0060553 A1 | 3/2010 | Zimmerman et al. |
| 2010/0078670 A1 | 4/2010 | Kim et al. |
| 2010/0123268 A1 | 5/2010 | Menard |
| 2010/0148198 A1 | 6/2010 | Sugizaki et al. |
| 2010/0186883 A1 | 7/2010 | Tomoda |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0317132 A1 | 12/2010 | Rogers et al. |
| 2011/0211348 A1 | 9/2011 | Kim |
| 2012/0119249 A1 | 5/2012 | Kim et al. |
| 2012/0223875 A1 | 9/2012 | Lau et al. |
| 2012/0228669 A1 | 9/2012 | Bower et al. |
| 2012/0314388 A1 | 12/2012 | Bower et al. |
| 2013/0015483 A1 | 1/2013 | Shimokawa et al. |

(56) References Cited

U.S. PATENT DOCUMENTS

| | | |
|---|---|---|
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0104243 A1 | 4/2014 | Sakariya et al. |
| 2014/0175498 A1 | 6/2014 | Lai |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0093600 A1 | 3/2016 | Bower et al. |
| 2017/0025484 A1* | 1/2017 | Forrest .................. H01L 51/56 |

FOREIGN PATENT DOCUMENTS

| | | |
|---|---|---|
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |

OTHER PUBLICATIONS

International Search Report, PCT/EP2015/063709, Dec. 15, 2015, 6 pages.

International Search Report, PCT/EP2015/069553, Nov. 27, 2015, 6 pages.

Lee, S. H. etal, Laser Lift-Offof GaN Thin Film and its Application to the Flexible Light Emitting Diodes, Proc. of SPIE 8460:846011-1-846011-6 (2012).

Choi, H. W. et al., Efficient GaN-based Micro-LED Arrays, Mat. Res. Soc. Symp. Proc. 743:L6.28.1-L6.28.6 (2003).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

* cited by examiner

US 9,716,082 B2

MICRO ASSEMBLED HYBRID DISPLAYS AND LIGHTING ELEMENTS

PRIORITY APPLICATION

This application claims priority to and the benefit of U.S. Provisional Patent Application No. 62/042,093, filed Aug. 26, 2014, titled "Micro Assembled Hybrid ILED-OLED Displays and Lighting Elements," the content of which is incorporated by reference herein in its entirety.

FIELD OF THE INVENTION

The present invention relates to displays including both organic and inorganic light emitters.

BACKGROUND OF THE INVENTION

Different types of light emitters have different performance characteristics that are more or less useful in different circumstances or when used in different ways. The various light-emitting technologies have different characteristics, advantages, and disadvantages. For example, liquid crystals are simple to control and have a highly developed and sophisticated technological infrastructure. Organic light-emitting diodes (organic LEDs) are area emitters, can be more efficient and flexible, and are demonstrated in a very thin form factor. Inorganic light-emitting diodes are very efficient and provide relatively saturated light in an environmentally robust structure. Lasers are also efficient, provide a virtually monochromatic light, but have a limited viewing angle. None of these technologies, however, meet all of a display viewer's needs under all circumstances.

The relative benefits of different kinds of inorganic LEDs can vary depending on the color of the light emitted, the use of the LEDs, and the ambient conditions. For example, LED efficiency, lifetime, and cost varies depending on the LED brightness, size, and color. Furthermore, the human visual system is more sensitive to some colors, for example green, and less sensitive to others, for example blue.

The relative benefits of ILEDS and OLEDs also vary based on the color of the light emitted by the light-emitting device. Micro-transfer-printed inorganic LEDs are bright (e.g., having intensities from 300 W/cm$^2$ to 500 W/cm$^2$) and enable low power consumption. However, for example, green ILEDs suffer from the "green gap", a portion of the light spectrum where the efficiency of green LEDs plummets.

OLEDs are thin, light, flexible, and consume less power than LCD displays. Additionally, OLEDs are easier to produce than the liquid crystals used in LCD displays. However, blue OLEDs have shorter lifetimes and are less efficient than red and green OLEDs. Similarly, red OLEDs have relatively longer lifetimes but are less efficient than green OLEDs. Moreover, the manufacturing process for dense arrays of OLEDs is relatively difficult and expensive. Furthermore, metal screens (fine metal masks) are used during the OLED manufacturing process to pattern the emitting materials deposited as layers onto the display substrate. These metal screens, also known as shadow masks, include rectangular openings (or apertures) for material deposition. A display (e.g., a 1024 by 768 display) can include almost eight hundred thousand pixels. Thus, openings in the mask must be created very precisely. This adds considerable expense to the OLED manufacturing process.

There is a need, therefore, for display structures with improved characteristics and manufacturing processes.

SUMMARY OF THE INVENTION

The disclosed technology provides a hybrid display with heterogeneous color pixels disposed on a display substrate. Each heterogeneous color pixel includes a first subpixel that emits a first color of light from a first light emitter and a second subpixel that emits a second color of light different from the first color of light from a second light emitter. The first light emitter is a different size from the second light emitter. Furthermore, the first and second light emitters can be of different types. In one embodiment, both the first and the second light emitters are inorganic, for example inorganic light-emitting diodes. In another embodiment, the first light emitter is inorganic and the second light emitter is organic. In certain embodiments, the light emitters can be micro assembled.

Light emitters that emit different colors of light have different efficiencies at different luminance levels. Therefore, in one embodiment, for example for a relatively dim application such as an indoor application, it can be useful to provide a relatively smaller light emitter that is more efficient at low luminance levels than a relatively larger light emitter that is less efficient at such a low luminance level. In another embodiment, it is useful to provide a relatively smaller light emitter that is more efficient at high luminance levels than a relatively larger light emitter that is less efficient at such a high luminance level. In yet another embodiment, it is useful to provide colored light emitters having sizes that match the corresponding color response of the human visual system. A larger response can correspond to a smaller emitter and vice versa.

The disclosed technology also provides micro assembled hybrid ILED-OLED displays and lighting elements. The displays and lighting elements utilize a mixture of ILEDs (e.g., micro-inorganic LEDs) and OLEDs. For example, each pixel in a display includes a mixture of ILEDs and OLEDs such that certain subpixels utilize ILEDs while other subpixels rely on OLEDs. The ILEDs are assembled utilizing micro-transfer printing techniques as they are too small (e.g., micro-ILEDs with a width or diameter of 10 μm to 50 μm), numerous, or fragile to assemble by conventional means. The use of small ILEDs in each pixel leaves additional space in each pixel for other devices, including larger OLEDs.

Hybrid displays provide an alternative approach that utilizes a mixture of ILEDs and OLEDs to optimize color quality, efficiency, and ease of manufacturability. In certain embodiments, red and blue micro-ILEDs form red and blue subpixels while a green OLED forms the green subpixel. The process of forming the green OLED does not require a high-resolution shadow mask which greatly enhances the manufacturability of utilizing OLEDs in large display formats.

The micro-ILEDs can be prepared on a native substrate and printed to a destination display substrate (e.g., a substrate of plastic, metal, glass, or other materials; transparent, rigid, or flexible materials), thereby obviating the manufacture of the micro-ILEDs on the destination substrate. This allows for other functions to be added to the pixel. Additionally, the OLED subpixel can be larger than the red and blue subpixels.

In certain embodiments, other micro devices, in addition to ILEDs and OLEDs, can be placed within each pixel. For example, micro sensing and micro integrated circuits (e.g., micro display drivers) can be placed within a pixel. Additionally, redundant micro-ILEDs can be placed in a pixel. Redundancy can increase the manufacturing yield of displays by allowing defective ILEDs to be replaced and/or supplemented by spare ILEDs. Redundant ILEDs, in certain embodiments, are electrically connected to the display upon a determination (e.g., during manufacturing or prior to distribution of the display) that a primary ILED is malfunctioning.

The displays can utilize a transparent (e.g., plastic or glass) substrate, and can be made to be light and flexible. Because the ILEDs take up a small proportion of the display area, and because the ILED wiring can be fine and/or transparent, the display itself can be transparent. The displays can emit light from the front side, the back side, or both sides. The display can even have an adhesive layer on one side, producing a decal-like display. The sparsely integrated ILEDs allow for new functions including microsensors, power harvesting, gesture sensing (both contact and non-contact), image capture, and the like. The displays can also include micro-transfer-printed μICs (micro-integrated circuits), which provide CMOS performance and embedded memory (e.g., non-volatile memory).

In certain embodiments, the electronically active components are transferred from a native substrate (e.g., inorganic semiconductor materials, single crystalline silicon wafers, silicon-on-insulator wafers, polycrystalline silicon wafers and GaAs wafers, Si (1 1 1), InP, InAlP, InGaAs, AlGaAs, GaSb, GaAlSb, AlSb, InSb, InGaAlSbAs, InAlSb, and InGaP) to a destination substrate (e.g., a non-native substrate used to, for example, form an array of the active components). The destination substrate can comprise, for example, glass, plastic, sapphire, metal, or another semiconductor. The transfer can be performed using an elastomer stamp. The release of the active components is controlled and predictable, thereby enabling production of the ILED displays described herein using micro transfer printing techniques. Regarding micro transfer printing, see, for example, U.S. Pat. No. 7,982,296, issued Jul. 19, 2011, the content of which is incorporated herein by reference in its entirety.

In one aspect, the disclosed technology includes a hybrid display, comprising: a plurality of pixels disposed on a display substrate, each pixel comprising a first subpixel that emits a first color of light and a second subpixel that emits a second color of light different from the first color of light, wherein light from the first subpixel is emitted by an inorganic light emitter and light from the second subpixel is emitted by an organic light emitter.

In certain embodiments, the inorganic light emitter is an inorganic light emitting diode (iLED) having a native semiconductor substrate separate and distinct from the display substrate.

In certain embodiments, the native semiconductor substrate of the iLED comprises a member selected from the group consisting of: an inorganic semiconductor material, single crystalline silicon wafer, silicon on insulator wafer, polycrystalline silicon wafer and GaAs wafer, Si (1 1 1), InP, InAlP, InGaAs, AlGaAs, GaSb, GaAlSb, AlSb, InSb, InGaAlSbAs, InAlSb, and InGaP.

In certain embodiments, the organic light emitter is an organic light-emitting diode (OLED) disposed on the display substrate.

In certain embodiments, comprising a third subpixel emitting a third color of light different from the first color and different from the second color, wherein light from the third subpixel is emitted by an inorganic light emitter.

In certain embodiments, the first subpixel is a red subpixel, the second subpixel is a green subpixel, and the third subpixel is a blue subpixel.

In certain embodiments, the display substrate has a transparency greater than or equal to 50%, 80%, 90%, or 95% for visible light.

In certain embodiments, the display substrate is a member selected from the group consisting of polymer, plastic, resin, polyimide, PEN, PET, metal, metal foil, glass, a semiconductor, and sapphire.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the inorganic light emitter has at least one of a width, length, and height from 2 to 5 μm, 5 to 10 μm, 10 to 20 μm, or 20 to 50 μm.

In certain embodiments, the display is an active-matrix display.

In certain embodiments, the display is a passive-matrix display.

In certain embodiments, each pixel comprises a fourth subpixel that emits a forth color of light.

In certain embodiments, the fourth subpixel is a yellow subpixel.

In certain embodiments, the area of the non-native substrate covered with ILEDs is no greater than 50%, 40%, 30%, 20%, 10%, 5%, or 3% of the display.

In certain embodiments, each pixel comprises a sensor.

In certain embodiments, the sensor comprises at least one of an infra-red sensor, temperature sensor, and capacitive sensor.

In certain embodiments, the number of sensors in the plurality of pixels is less than the number of ILEDs in the plurality of pixels.

In certain embodiments, the number of sensors in the plurality of pixels is equal to or larger than the number of ILEDs in the plurality of pixels.

In certain embodiments, each pixel comprises a integrated circuit electrically connected to each subpixel in a respective pixel.

In certain embodiments, the integrated circuits are on the same plane as the light emitters.

In certain embodiments, each integrated circuit is used to control different types of light emitters.

In certain embodiments, each integrated circuit processes signals from sensing elements.

In certain embodiments, each set of light emitters is driven by a respective integrated circuit forms an independent sub-display.

In certain embodiments, each integrated circuit is connected to one or more integrated antennas.

In certain embodiments, the integrated circuits have built-in redundancy.

In certain embodiments, the display substrate is flexible.

In certain embodiments, the display includes reflective structures covering a least a portion of the light emitters in each pixel.

In certain embodiments, the reflective structures cover at least a side of the light emitters in each pixel.

In certain embodiments, at least one of the inorganic light emitters and organic light emitters comprises at least one material that is substantially transparent to a specific wavelength, and the non-native substrate is transparent to the specific wavelength.

In certain embodiments, the display includes a dielectric material (e.g. silicon oxide or silicon nitride) covering a side, opposite the display substrate, of at least one of the inorganic light emitters and organic light emitters.

In certain embodiments, each of the inorganic light emitters has two or more contacts on a side of the inorganic light emitters opposite the interface between the inorganic light emitters and the display substrate.

In certain embodiments, the display includes an insulating layer surrounding a perimeter of at least a portion of the light emitters.

In certain embodiments, the insulating layer comprises: a layer of photo-definable dielectric (e.g., BCB, polyimide, PBO, epoxy, or silicone) cross linked except in the regions above the one or more metal contacts.

In another aspect, the disclosed technology includes a method of micro assembling a hybrid display having a plurality of pixels, each pixel comprising inorganic light emitting diodes (ILEDs) and organic light emitting diodes (OLEDs), the method comprising: providing a plurality of ILEDs; and micro transfer printing the plurality of printable ILEDs onto a display substrate separate and distinct from the semiconductor substrates of the iLEDs, wherein the ILEDs are electrically connected following printing onto the non-native substrate; forming an OLED in each pixel of the hybrid display; and forming a plurality of anodes (e.g., ITO anode) for a plurality of green OLED on the surface of a display substrate, wherein the plurality of anodes are formed prior to micro transfer printing the plurality of ILEDs.

In certain embodiments, forming the OLEDs comprises evaporating OLED layers.

In certain embodiments, the OLED layers are evaporated through a coarse shadow mask.

In certain embodiments, forming the OLEDs comprises depositing a cathode metal.

In certain embodiments, the cathode metal is deposited through a coarse shadow mask.

In certain embodiments, the plurality of ILEDs comprise red ILEDS that emit red light and blue ILEDs that emit blue light.

In certain embodiments, the plurality of OLEDs comprise green OLEDS that emit green light.

In certain embodiments, each pixel comprises a first, second, and third subpixel, and the first subpixel comprises at least two red ILEDs, the second subpixel comprises the green OLED, and the third subpixel comprises at least two blue ILEDs.

In certain embodiments, the second subpixel is larger than the first subpixel and is larger than the third subpixel.

In certain embodiments, each of the plurality of ILEDs comprises at least one material that is substantially transparent to a specific wavelength, and the display substrate is transparent to the specific wavelength.

In certain embodiments, each of the OLEDs comprises at least one material that is substantially transparent to a specific wavelength, and the display substrate is transparent to the specific wavelength.

In certain embodiments, a dielectric material (e.g. silicon oxide or silicon nitride) covers a side, opposite the display substrate, of at least one of the plurality of ILEDs and OLEDs.

In certain embodiments, each of the ILEDs has two or more contacts on a side of the ILEDs opposite the interface between the ILED and the display substrate.

In certain embodiments, the method includes, prior to forming connections to the plurality of ILEDs, providing an insulating layer surrounding a perimeter of at least a portion of the ILEDs.

In certain embodiments, providing an insulating layer surrounding the perimeter of each of the plurality of ILEDs comprises:
depositing a layer of photo-definable dielectric;
exposing the photoactive dielectric to light; and
cross linking the photo-definable material except in the regions above the one or more metal contacts.

In certain embodiments, the method includes transferring a plurality of integrated circuits to the display substrate.

In certain embodiments, the method includes electrically connecting each integrated circuit to a set of ILEDs.

In certain embodiments, each IC is used to control different types of ILEDs.

In certain embodiments, each IC processes signals from sensing function elements.

In certain embodiments, each IC processes control signals to functional array elements.

In certain embodiments, each set of ILEDs driven by a respective integrated circuit forms an independent sub-display.

In certain embodiments, each integrated circuit is connected to one or more integrated antennas.

In certain embodiments, each integrated circuit is connected to one or more integrated antennas.

In certain embodiments, the plurality of integrated circuits has built-in redundancy.

In certain embodiments, each of the plurality of integrated circuits contains embedded memory.

In certain embodiments, the method includes transferring a plurality of sensing devices to the display substrate.

In certain embodiments, providing micro assembled sensing devices comprises providing two or more types of temperature sensing devices.

In certain embodiments, the number of sensing elements is less than the number of ILEDs in the display.

In certain embodiments, the number of sensing elements is equal to or larger than the number of ILEDs in the display.

In certain embodiments, the method includes prior to printing the ILEDs to the non-native substrate, exposing the junction perimeter of each ILED diode (e.g., by etching); and causing regrowth of a high band gap semiconductor (e.g., InGaAlP, InGaN, GaN, AlGaN) on the exposed junction perimeter, thereby reducing non-radiative recombination in the ILED.

In certain embodiments, the native substrate comprises a member selected from the group consisting of: an inorganic semiconductor material, single crystalline silicon wafer, silicon on insulator wafer, polycrystalline silicon wafer and GaAs wafer, Si (1 1 1), InP, InAlP, InGaAs, AlGaAs, GaSb, GaAlSb, AlSb, InSb, InGaAlSbAs, InAlSb, and InGaP.

In another aspect, the disclosed technology includes a hybrid display, the hybrid display including a plurality of heterogeneous pixels disposed on a display substrate, each pixel comprising a first subpixel that emits a first color of light and a second subpixel that emits a second color of light different from the first color of light, wherein light from the first subpixel is emitted by a first light emitter and light from the second subpixel is emitted by a second light emitter having a different size than the first light emitter.

In certain embodiments, the first light emitter is an inorganic light emitter and the second light emitter is an organic light emitter.

In certain embodiments, the first light emitter is an inorganic light emitter and the second light emitter is an inorganic light emitter.

In certain embodiments, the native semiconductor substrate of each of the inorganic light emitters comprises a member selected from the group consisting of: an inorganic semiconductor material, single crystalline silicon wafer, silicon on insulator wafer, polycrystalline silicon wafer and GaAs wafer, Si (1 1 1), InP, InAlP, InGaAs, AlGaAs, GaSb, GaAlSb, AlSb, InSb, InGaAlSbAs, InAlSb, and InGaP.

In certain embodiments, the inorganic light emitters have at least one of a width, length, and height from 2 to 5 µm, 5 to 10 µm, 10 to 20 µm, or 20 to 50 µm.

In certain embodiments, the display includes a display substrate on which the light emitters are disposed and wherein the area of the display substrate covered with inorganic light emitters is no greater than 50%, 40%, 30%, 20%, 10%, 5%, or 3% of the display.

In certain embodiments, the display includes a third light emitter.

In certain embodiments, the third light emitter has a different size than the first light emitter, a different size than the second light emitter, or a different size than the first light emitter and the second light emitter.

In certain embodiments, the first light emitter is a red light emitter that emits red light, the second light emitter is a green light emitter that emits green light, and the third light emitter is a blue light emitter that emits blue light.

In certain embodiments, the green light emitter is smaller than at least one of the red light emitter and the blue light emitter.

In certain embodiments, the green light emitter is larger than at least one of the red light emitter and the blue light emitter.

In certain embodiments, the red light emitter is larger than at least one of the green light emitter and the blue light emitter.

In certain embodiments, the blue light emitter is larger than at least one of the green light emitter and the red light emitter.

In certain embodiments, the red light emitter is smaller than at least one of the green light emitter and the blue light emitter.

In certain embodiments, the first light emitter emits a different hue, tint, or shade of a color of light than the second light emitter in response to a common control signal; the first light emitter emits a different brightness than the second light emitter in response to a common control signal; the first light emitter has a different efficiency than the second light emitter; the first light emitter has a different angular distribution of emitted light than the second light emitter; the first light emitter has a different electronic property or response than the second light emitter; the first light emitter emits light using a different physical mechanism than the second light emitter; or the first light emitter has a different physical structure than the second light emitter.

In certain embodiments, the first light emitter or the second light emitter is an inorganic light emitter, an organic light emitter, an inorganic light-emitting diode, an organic light-emitting diode, a laser, a vertical cavity surface emission laser, or an optically pumped or electrically controlled phosphor, nano-crystal, or quantum dot.

In certain embodiments, the display includes a pixel controller for controlling the first and second light emitters and wherein the pixel controller comprises a control circuit that controls the first light emitter differently from the second light emitter.

In certain embodiments, the display includes a display substrate on which the light emitters are disposed and wherein the display substrate has a transparency greater than or equal to 50%, 80%, 90%, or 95% for visible light.

In certain embodiments, the display substrate is a member selected from the group consisting of polymer, plastic, resin, polyimide, PEN, PET, metal, metal foil, glass, a semiconductor, and sapphire.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the display is an active-matrix display.

In certain embodiments, the display is a passive-matrix display.

In certain embodiments, each heterogeneous pixel comprises a fourth sub-pixel that emits a fourth color of light.

In certain embodiments, the fourth subpixel is a yellow subpixel.

In certain embodiments, each pixel comprises a sensor.

In certain embodiments, the sensor comprises at least one of an infra-red sensor, temperature sensor, and capacitive sensor.

In certain embodiments, each pixel comprises a integrated circuit electrically connected to each subpixel in a respective pixel.

In certain embodiments, the integrated circuits are on the same plane as the light emitters.

In certain embodiments, each integrated circuit is used to control different types of light emitters.

In certain embodiments, each integrated circuit processes signals from sensing elements.

In certain embodiments, the integrated circuits have built-in redundancy.

In certain embodiments, the display includes reflective structures covering at least a portion of the light emitters in each pixel.

In certain embodiments, the reflective structures cover at least a side of the light emitters in each pixel.

In certain embodiments, each of the inorganic light emitters has two or more contacts on a side of the inorganic light emitters opposite the interface between the inorganic light emitters and the display substrate.

BRIEF DESCRIPTION OF THE FIGURES

The foregoing and other objects, aspects, features, and advantages of the present disclosure will become more apparent and better understood by referring to the following description taken in conjunction with the accompanying drawings, in which.

The features and advantages of the present disclosure will become more apparent from the detailed description set forth below when taken in conjunction with the drawings, in which like reference characters identify corresponding ele-

DETAILED DESCRIPTION OF THE INVENTION

Figure 1:
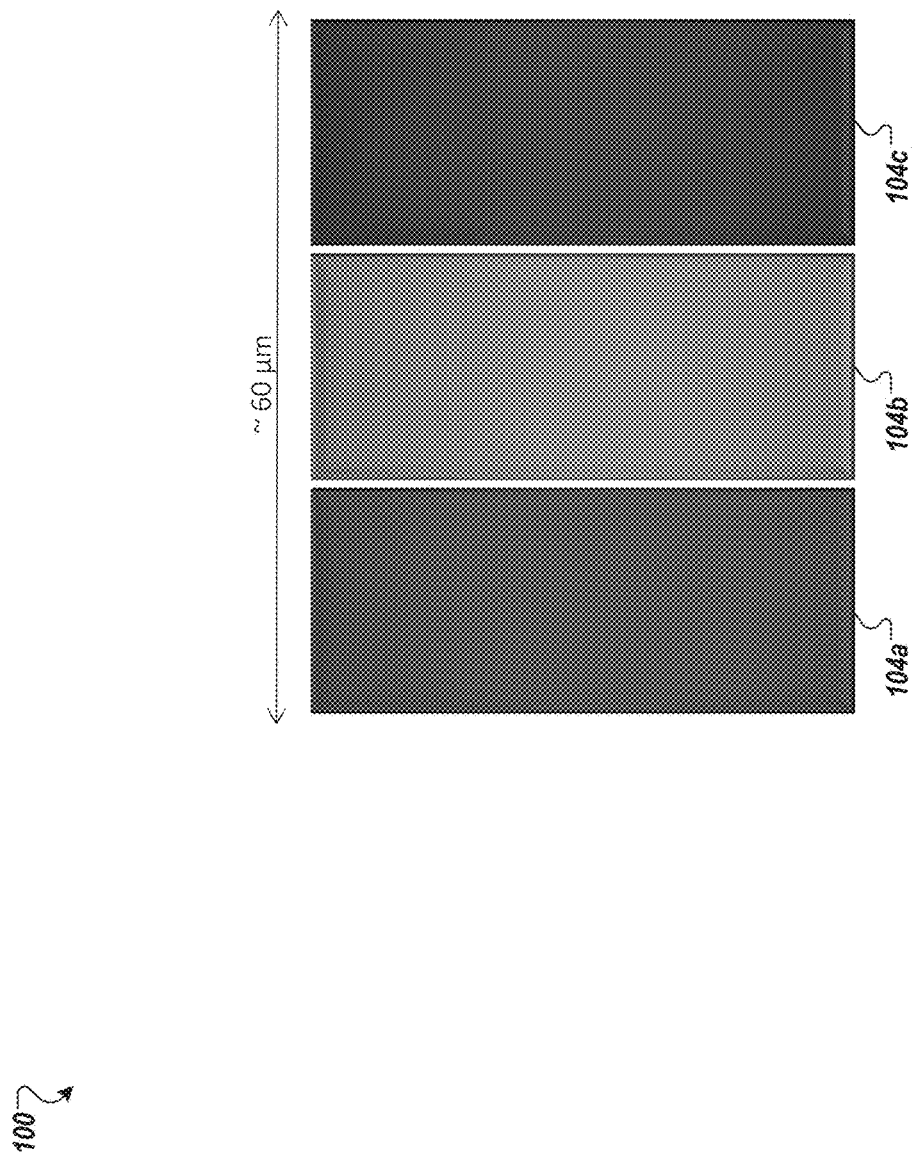
FIG. 1 is an illustration of a typical prior-art pixel used in an LCD display.

As used herein the expression "semiconductor element" and "semiconductor structure" are used synonymously and broadly refer to a semiconductor material, structure, device, or component of a device. Semiconductor elements include high-quality single crystalline and polycrystalline semiconductors, semiconductor materials fabricated via high-temperature processing, doped semiconductor materials, organic and inorganic semiconductors, and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light-emitting diodes, lasers, p-n junctions, photodiodes, integrated circuits, and sensors. In addition, semiconductor element can refer to a part or portion that forms an functional semiconductor device or product.

"Semiconductor" refers to any material that is a material that is an insulator at a very low temperature, but which has an appreciable electrical conductivity at temperatures of about 300 Kelvin. The electrical characteristics of a semiconductor can be modified by the addition of impurities or dopants and controlled by the use of electrical fields. In the present description, use of the term semiconductor is intended to be consistent with use of this term in the art of microelectronics and electronic devices. Semiconductors useful in the present invention can include elemental semiconductors, such as silicon, germanium and diamond, and compound semiconductors, for example group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa1-_xAs$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light-emitting materials, such as light-emitting diodes (LEDs) and solid-state lasers. Impurities of semiconductor materials are atoms, elements, ions or molecules other than the semiconductor material(s) themselves or any dopants provided in the semiconductor material. Impurities are undesirable materials present in semiconductor materials that can negatively impact the electronic properties of semiconductor materials, and include but are not limited to oxygen, carbon, and metals including heavy metals. Heavy-metal impurities include, but are not limited to, the group of elements between copper and lead on the periodic table, calcium, sodium, and all ions, compounds and/or complexes thereof.

"Substrate" refers to a structure or material on which, or in which, a process is (or has been) conducted, such as patterning, assembly or integration of semiconductor elements. Substrates include, but are not limited to: (i) a structure upon or in which semiconductor elements are fabricated (also referred to as a native substrate); (ii) a device substrate, for example an electronic device substrate; (iii) a donor substrate having elements, such as semiconductor elements, for subsequent transfer, assembly or integration such as a semiconductor wafer; and (iv) a target or destination non-native substrate for receiving printable structures, such as semiconductor elements. A donor substrate can be, but is not necessarily, a native substrate.

"Display substrate" as used herein refers to the target substrate (e.g., non-native destination substrate) for receiving printable structures, such as semiconductor elements. Examples of display substrate materials include polymer, plastic, resin, polyimide, polyethylene naphthalate, polyethylene terephthalate, metal, metal foil, glass, flexible glass, a semiconductor, and sapphire.

The terms "micro" and "micro-device" as used herein refer to the descriptive size of certain devices or structures in accordance with embodiments of the invention. As used herein, the terms "micro" and "micro-device" are meant to refer to structures or devices on the scale of 0.5 to 250 µm. However, it is to be appreciated that embodiments of the present invention are not necessarily so limited, and that certain aspects of the embodiments can be applicable to larger or smaller size scales.

As used herein, "micro-ILED" refers to an inorganic light-emitting diode on the scale of 0.5 to 250 µm. For example, micro-LEDs can have at least one of a width, length, and height (or two or all three dimensions) from 0.5 to 2 µm, 2 to 5 µm, 5 to 10 µm, 10 to 20 µm, 20 to 50 µm, 20 to 50 µm, 50 to 100 µm, or 100 to 250 µm. Micro-LEDs emit light when energized. The color of the light emitted by an LED varies depending upon the structure of the micro-LED. For example, when energized a red micro-LED emits red light, a green micro-LED emits green light, a blue micro-LED emits blue light, a yellow micro-LED emits yellow light, and a cyan micro-LED emits cyan light.

"Printable" relates to materials, structures, device components, or integrated functional devices that are capable of transfer, assembly, patterning, organizing, or integrating onto or into substrates without exposure of the substrate to high temperatures (e.g. at temperatures less than or equal to about 400, 200, or 150 degrees Celsius). In one embodiment of the present invention, printable materials, elements, device components, or devices are capable of transfer, assembly, patterning, organizing or integrating onto or into substrates via solution printing, micro-transfer printing, or dry transfer contact printing.

"Printable semiconductor elements" of the present invention comprise semiconductor structures that can be assembled or integrated onto substrate surfaces, for example by using dry transfer contact printing, micro-transfer printing, or solution printing methods. In one embodiment, printable semiconductor elements of the present invention are unitary single crystalline, polycrystalline or microcrystalline inorganic semiconductor structures. In the context of this description, a unitary structure is a monolithic element having features that are mechanically connected. Semiconductor elements of the present invention can be undoped or doped, can have a selected spatial distribution of dopants and can be doped with a plurality of different dopant materials, including p- and n-type dopants. The present invention includes microstructured printable semiconductor elements having at least one cross-sectional dimension greater than or equal to about 1 micron and nanostructured printable semiconductor elements having at least one cross-sectional dimension less than or equal to about 1 micron. Printable semiconductor elements useful in many applications comprise elements derived from "top down" processing of high-purity bulk materials, such as high-purity crystalline semiconductor wafers generated using conventional high-temperature processing techniques. In one embodiment, printable semiconductor elements of the present invention comprise composite structures having a semiconductor operationally connected to at least one additional device component or structure, such as a conducting layer, dielectric layer, electrode, additional semiconductor structure, or any combination of these. In one embodiment, printable semiconductor elements of the present invention comprise stretchable semiconductor elements or heterogeneous semiconductor elements.

The term "flexible" refers to the ability of a material, structure, device or device component to be reversibly deformed into a curved shape, e.g., without undergoing a transformation that introduces significant strain, such as strain characterizing the failure point of a material, structure, device, or device component.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which can provide desired chemical or physical properties. "Dielectric" and "dielectric material" are used synonymously in the present description and refer to a substance that is highly resistant to a flow of electric current and can be polarized by an applied electric field. Useful inorganic dielectric materials include, but are not limited to, $SiO_2$, $Ta_2O_5$, $TiO_2$, $ZrO_2$, $Y_2O_3$, $SiN_4$, STO, BST, PLZT, PMN, and PZT. Organic dielectric materials can include polymers and resins, including curable polymers having cross-linking materials, for example cross-linkable in response to heat or ultra-violet radiation.

"Polymer" refers to a molecule comprising a plurality of repeating chemical groups, typically referred to as monomers. Polymers are often characterized by high molecular masses. Polymers useable in the present invention can be organic polymers or inorganic polymers and can be in amorphous, semi-amorphous, crystalline or partially crystalline states. Polymers can comprise monomers having the same chemical composition or can comprise a plurality of monomers having different chemical compositions, such as a copolymer. Cross-linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Micro-transfer printing" as used herein refers to systems, methods, and techniques for the deterministic assembly of micro- and nano-materials, devices, and semiconductor elements into spatially organized, functional arrangements with two-dimensional and three-dimensional layouts. It is often difficult to pick up and place ultra-thin or small devices, however, micro-transfer printing permits the selection and application of these ultra-thin, fragile, or small devices, such as micro-LEDs, without causing damage to the devices themselves. Microstructured stamps (e.g., elastomeric, electrostatic stamps, or hybrid elastomeric/electrostatic stamps) can be used to pick up micro devices, transport the micro devices to a destination substrate, and print the micro devices onto the destination substrate. In some embodiments, surface adhesion forces are used to control the selection and printing of these devices onto the destination substrate. This process can be performed massively in parallel. The stamps can be designed to transfer a single device or hundreds to thousands of discrete structures in a single pick-up-and-print operation. For a discussion of micro-transfer printing generally, see U.S. Pat. Nos. 7,622, 367 and 8,506,867, each of which is hereby incorporated by reference in its entirety.

A heterogeneous pixel is a pixel that includes heterogeneous or different first and second light emitters that are not alike, or are dissimilar, that are different in kind, or are composed of parts of different kinds, different elements, or constituents. As intended herein, heterogeneous light emitters are light emitters that are intended to operate or function differently even when driven with common control signals. For example, heterogeneous light emitters can operate differently, have different functions, or function differently. Similar devices that are made and intended to function identically are not considered heterogeneous devices herein, even if unavoidable and unintended differences exist between the similar devices. For example, it is known that because of manufacturing and material tolerances, light-emitting diodes can have unintended slightly different emission spectra and performance. Devices having variations that are consequences of imperfect materials or processes are not considered heterogeneous, different, or operationally different herein, since such variable devices are not intended to operate or function differently but are rather desired to behave identically. As used herein, heterogeneous, different, or operationally different light emitters are intended to behave, function, perform, act, or operate differently. Alternatively or in addition, as used herein heterogeneous, different, or operationally different light emitters are intended to have different purposes, aims, uses, or roles in the display of the present invention. Similar devices that simply emit different colors of light are not considered heterogeneous.

According to embodiments of the present invention, the differences in the first and second light emitters within a heterogeneous pixel can include any of the following or a combination thereof:

differences in brightness of the different first and second light emitters in response to a common control signal;

differences in size of the different first and second light emitters;

differences in size of the light-emissive area of the different first and second light emitters;

differences in efficiency of the different first and second light emitters;

differences in the electronic properties or response of the different first and second light emitters;

differences in the angular distribution of emitted light of the different first and second light emitters;

differences in the mechanism by which light is emitted by the different first and second light emitters; or differences in the physical structure of the different first and second light emitters.

As used herein, a difference in size or light-emissive area means that the first light emitter has a different physical size or light emitting area than the second light emitter.

As used herein, a difference in brightness means that the first light emitter emits more or fewer photons than the second light emitter. The difference in brightness can be an absolute limit in achievable brightness or an absolute limit on the ability to limit brightness (e.g., a lower limit on the black level). The difference in brightness can also be a difference in the photons emitted in response to a common control signal.

As used herein, a difference in efficiency means that the first light emitter emits more or fewer photons than the second light emitter in response to a common control signal or power.

As used herein, a difference in angular distribution of emitted light means that the first light emitter emits light at a wider or narrower range of angles than the second light emitter. For example, the first light emitter can emit light with a Lambertian distribution and the second light emitter cannot.

As used herein, a difference in electronic property or response means that the first light emitter functions differently in an electronic circuit than the second light emitter. For example, the first light emitter can have a different resistance, capacitance, or breakdown voltage than the second light emitter. The first light emitter could be a diode and the second light emitter could not be a diode. Both the first light emitter and the second light emitter could be diodes but with different turn-on voltages, or could be diodes of different types.

As used herein, a difference in physical mechanism for emitting light means that the first light emitter uses a different physical property for emitting light than the second light emitter. For example, the first light emitter could be a light-emitting diode and the second light emitter could use optically pumped phosphors, or radiation due to heating.

As used herein, a difference in physical structure means that the first light emitter uses different materials or arrangements of materials for emitting light than the second light emitter. For example, the first light emitter could be an inorganic light emitter and the second light emitter could use an organic light emitter. Alternatively, the first light emitter could be a point light emitter and the second light emitter could be a one dimensional (line) or two-dimensional (area) emission, for example a diode, filament, cylinder, or plane segment (e.g., rectangle).

Therefore, in an embodiment of the present invention, a hybrid display includes a plurality of heterogeneous pixels disposed on a display substrate. Each pixel comprises a first subpixel that emits a first color of light and a second subpixel that emits a second color of light different from the first color of light. Light from the first subpixel is emitted by a first light emitter and light from the second subpixel is emitted by a second light emitter having a different size than the first light emitter. In an embodiment, the first light emitter is an inorganic light emitter and the second light emitter is an organic light emitter. Alternatively, the first light emitter is an inorganic light emitter and the second light emitter is also an inorganic light emitter.

In a further embodiment of the present invention, the hybrid display includes a third light emitter. The third light emitter can have a different size than the first light emitter, a different size than the second light emitter, or a different size than the first light emitter and the second light emitter. The first light emitter can be a red light emitter that emits red light, the second light emitter can be a green light emitter that emits green light, and the third light emitter can be a blue light emitter that emits blue light.

According to various circumstances, ambient conditions, in particular ambient illumination, or use, the first, second, and third light emitters can have different sizes. For example, the green light emitter is smaller than the red light emitter or the blue light emitter. In an embodiment, this is useful because the human visual system is more responsive to green than other colors and therefore a smaller emitter can provide adequate luminance for green. Moreover, in some technologies, green light emission is more efficient, for example OLED devices.

In another example, the green light emitter is larger than the red light emitter or the blue light emitter. In some embodiments, green light emitters are less efficient, or become less efficient at higher luminance levels, for example some forms of micro-LEDs suffer from such issues such as droop. A larger emitter can compensate for a smaller light output.

In another example, the red light emitter is larger than the green light emitter or the blue light emitter. In some embodiments, red light emitters cannot readily emit large amounts of light, particularly for small micro LEDs. Thus, a larger red emitter can be necessary for some applications.

In yet another example, the blue light emitter is larger than the green light emitter or the red light emitter. The human visual system has a relatively low response to blue colors and in some applications a brighter blue light can be preferred. A larger blue emitter can compensate for a smaller light output.

In another example, the red light emitter is smaller than the green light emitter or the blue light emitter. In some embodiments, red light emitters have parasitic perimeter currents and low efficiency at low current density. Smaller red emitters have smaller perimeter currents than larger red emitters and operate at higher current densities for a given drive current. As a result, the smaller red emitters in some embodiments operate at higher efficiencies than larger red emitters. Furthermore, smaller red emitters require higher voltages to operate at a given drive current thereby making their voltage of operation more like blue and green LEDs than larger red emitters.

In embodiments of the present invention, the first light emitter emits a different hue, tint, or shade of a color of light than the second light emitter in response to a common control signal, the first light emitter emits a different brightness than the second light emitter in response to a common control signal, the first light emitter has a different efficiency than the second light emitter, the first light emitter has a different angular distribution of emitted light than the second light emitter, the first light emitter has a different electronic property or response than the second light emitter, the first light emitter emits light using a different physical mechanism than the second light emitter, or the first light emitter has a different physical structure than the second light emitter.

In some embodiments, the first light emitter or the second light emitter is an inorganic light emitter, an organic light emitter, an inorganic light-emitting diode, an organic light-emitting diode, a laser, a vertical cavity surface emission laser, or an optically pumped or electrically controlled phosphor, nano-crystal, or quantum dot.

The hybrid display of the present invention can further include a pixel controller for controlling the first and second light emitters. The pixel controller can have a control circuit that controls the first light emitter differently from the second light emitter.

The substrate of each of the inorganic light emitters can be a native semiconductor substrate on or in which the inorganic light emitters are formed, for example a member selected from the group consisting of: an inorganic semiconductor material, single crystalline silicon wafer, silicon on insulator wafer, polycrystalline silicon wafer and GaAs wafer, Si (1 1 1), InP, InAlP, InGaAs, AlGaAs, GaSb, GaAlSb, AlSb, InSb, InGaAlSbAs, InAlSb, and InGaP. The inorganic light emitters can have at least one of a width, length, and height from 2 to 5 µm, 5 to 10 µm, 10 to 20 µm, or 20 to 50 µm.

The light emitters can be disposed on a display substrate. In an embodiment, the area of the display substrate covered with inorganic light emitters is no greater than 50%, 40%, 30%, 20%, 10%, 5%, or 3% of the display.

The disclosed technology also relates to hybrid displays with pixels that include both inorganic light emitting diodes (ILEDs) and organic light emitting diodes (OLEDs). OLEDs are typically expensive to manufacture and it is often difficult to form a small RGB pixel with OLEDs. However, certain OLEDs are more efficient than ILEDs. For example, green OLEDs are currently more efficient than their ILED counterparts. The disclosed technology provides a hybrid display that uses a mixture of ILEDs and OLEDs in each pixel. For example, in certain embodiments, each pixel in the hybrid display includes a red ILED, a blue ILED, and a green OLED. In this instance, the OLED process would not require a high-resolution shadow mask, thereby enhancing the manufacturability of OLEDs for larger formats. Additionally, the OLED process in this example would not require any fine lithography, typically required of conventional methods. The OLED subpixel (e.g., green subpixel) can be larger and the ILEDs can be small (e.g., micro-red and micro-blue ILEDs). The use of small ILEDs allows for other functions to be added to the pixel, such as micro sensors and micro integrated circuits.

The OLEDs can be formed on the display substrate before or after the micro-ILEDs or other functions are printed to the display substrate. Microstructured stamps can be used to pick up micro devices, transport the micro devices to the destination, and print the micro devices onto a display substrate. Surface adhesion forces are used to control the selection and printing of these devices onto the display substrate. This process can be performed massive in parallel. The stamps can be designed to transfer hundreds to thousands of discrete structures in a single pick-up and print operation.

Micro transfer printing also enables parallel assembly of high-performance semiconductor devices onto virtually any substrate material, including glass, plastics, metals or other semiconductors. The substrates can be flexible, thereby permitting the production of flexible electronic devices. Flexible substrates can be integrated in a large number of configurations, including configurations not possible with brittle silicon-based electronic devices. Additionally, plastic substrates, for example, are mechanically rugged and can be used to provide electronic devices that are less susceptible to damage or electronic performance degradation caused by mechanical stress. Thus, these materials can be used to fabricate electronic devices by continuous, high-speed, printing techniques capable of generating electronic devices over large substrate areas at low cost (e.g., roll-to-roll manufacturing).

Moreover, these micro transfer printing techniques can be used to print semiconductor devices at temperatures compatible with assembly on plastic polymer substrates. In addition, semiconductor materials can be printed onto large areas of substrates thereby enabling continuous, high-speed printing of complex integrated electrical circuits over large substrate areas. Moreover, fully flexible electronic devices with good electronic performance in flexed or deformed device orientations can be provided to enable a wide range of flexible electronic devices.

FIG. 1 is an illustration of a typical pixel 100 used, for example, in an LCD display. The pixel 100 includes three subpixels 104, a red subpixel 104a, a green sub pixel 104b, and a blue subpixel 104c. In a liquid crystal display, a color filter is typically used to create the color for each subpixel 104a, 104b, 104c while a backlight is used to illuminate the filters. The intensity of each subpixel can be controlled through the variation of voltage applied to each subpixel such that a wide range of brightness levels (e.g., 256 brightness levels) are produced by each subpixel 104a, 104b, 104c (e.g., 256 levels of red, 256 levels of green, and 256 levels of blue). In a liquid crystal display, the voltage is applied to a liquid crystal layer that twists based on the voltage applied, thereby varying the amount of light from the backlight that passes through the liquid crystals and thus the color filters for each subpixel 104a, 104b, 104c.

Figure 2:
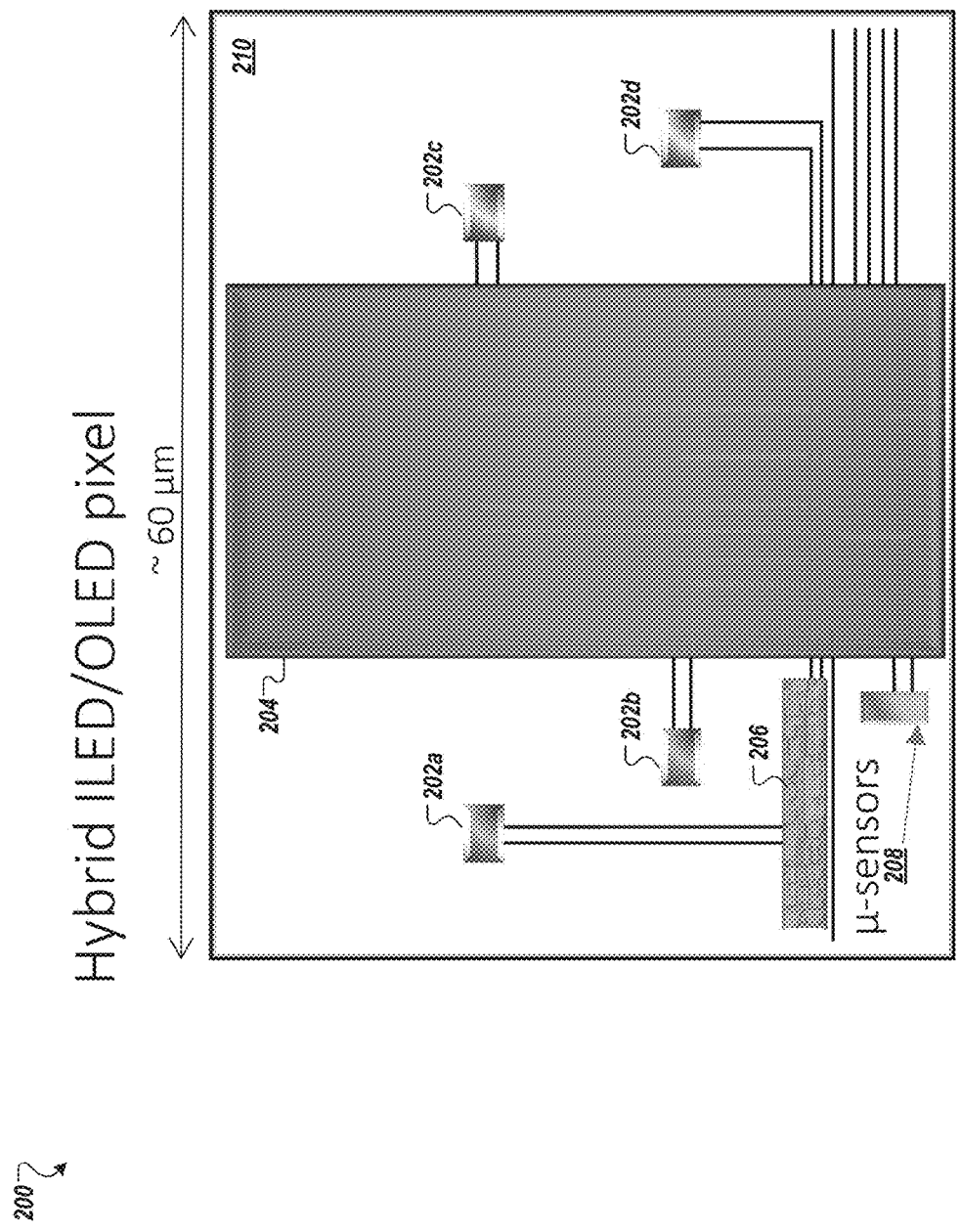
FIG. 2 is an illustration of an example pixel constructed in accordance with an embodiment of the present invention.

FIG. 2 is an illustration of an example pixel 200 constructed in accordance with the disclosed technology. In this example, the pixel 200 has a similar size as the pixel 100 shown in FIG. 1, however, the pixel 200 shown in FIG. 2 is constructed using micro-ILEDs 202a-d and OLED 204. The micro-ILEDs 202 a-d can be micro transfer printed onto a display substrate, such as a transparent (including semi-transparent, virtually transparent, and mostly transparent) and/or flexible substrates. For example, the display substrate can be plastic, glass, or sapphire.

The display 200 includes micro-transfer printed redundant RGB micro-ILEDs 202a-d that exhibit low power consumption while still projecting bright light. In certain embodiments, each primary ILED (e.g., 202a, 202c) includes a redundant, spare ILED (e.g., 202b, 202d, respectively). In certain embodiments, the sparsely integrated micro-ILEDs 202 a-d allow for new functional devices to be placed within each pixel, such as micro-sensors 208, power harvest devices, gesture sensors, and image capture devices. Micro-integrated circuits 206 (e.g., CMOS performance) can be micro-transfer printed to drive the micro-ILEDs 202 and OLED 204. The micro-integrated circuits 206 can include embedded memory (e.g., non-volatile memory). Memory can be used to display static images without constantly needing to refresh the display, which saves power. The memory can also store a look-up table(s) used, for example, to adjust the output of ILEDs 202 a-d and OLED 204 in the display. In addition to emitting light from the front of the display 200, the ILEDs 202a-d and OLED 204 can also emit light from the back side. The display 200 can include an adhesive layer on one side, producing a decal-like display. The wiring used in the display, such as the wiring used to electronically couple the micro-ILEDs 202 *a-d*, OLED 204, and sensors 208 to the integrated circuit 206, can be fine wires or transparent wires.

Micro-assembled sparsely integrated high-performance light emitters 202*a-d* (micro-ILEDs), OLED 204, and drivers 206 (micro-drivers) make bright displays that are flexible, draw less power or occupy only a small fraction of the display plane 210 than comparable LCD or OLED displays. For example, the present invention can provide a display having a fill factor of less than 50%, 40%, or 35%. Although the prior-art display of FIG. 1 illustrates three sub-pixels of the same size, in practice for an OLED display the more-efficient green organic light emitter can be smaller than the red or blue light emitters. Thus, in further embodiments of the present invention, the display can have a fill factor less than 30%, less than 25%, or less than 20% compared to other LCD or OLED displays. The additional free space facilitates devices with more function (e.g., micro sensor 208) to be placed on the display plane, such as gesture recognition, power harvesting, redundancy, image or light capture (e.g., optical sensors, photodiodes), infrared sensors (e.g., for gesture sensing, IR camera), temperature sensors (e.g., ILED temperature feedback to provide color/brightness correction), or wireless data collection or transmission devices. The display can also include power harvesting devices such as solar cells (collection of light), motion-energy scavenging (e.g., piezoelectrics), capacitors to store energy, and/or antennas for harvesting electromagnetic radiation. The transfer-printed elements interlaced with the display can be printed at different densities (sparseness) according to the desired function and application. For example, temperature sensors can be included in every other pixel while an image-capture device is included in each pixel. Additionally, the small operational area occupied by the micro-ILEDs allows for construction of transparent displays, multi-mode displays, redundancy of ILEDs and other devices, and super-bright displays.

Figure 3:
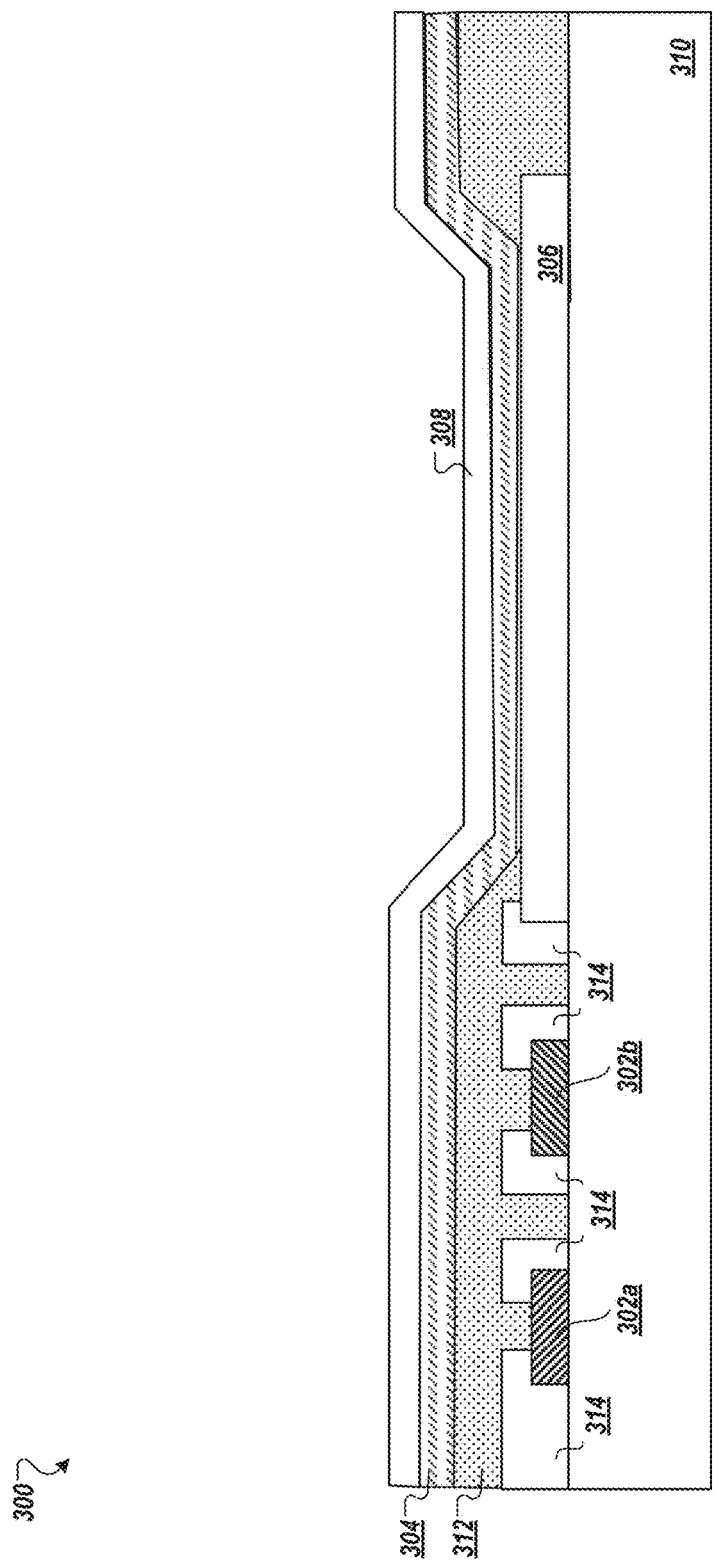
FIG. 3 is an illustration of an example cross-sectional view of a pixel of a hybrid display according to an embodiment of the present invention.

FIG. 3 is an illustration of an example cross-sectional view of a pixel 300 of a hybrid display according to an embodiment of the present invention. In this example the pixel includes a red micro-ILED 302*a*, blue micro-ILED 302*b*, and green OLED 304; however, other combinations are possible. The devices are on the display substrate 310. The display substrate 310 can be glass, plastic, sapphire, or other materials. The red micro-ILED 302*a* and blue micro-ILED 302*b* can be micro transfer printed onto the display substrate. This can be done before or after the OLED 304 is formed. In certain embodiments, this occurs after the OLED 304 has been partially formed.

In certain embodiments, Indium Tin Oxide (ITO) is deposited or patterned on the display substrate 310 to form an anode 306. The micro-LEDs 302 can be micro-assembled onto the display substrate 310. The red micro-ILED 302*a*, blue micro-ILED 302*b*, and green OLED 304 are electrically connected to the appropriate driving circuitry by metal wiring 314. In certain embodiments, a bank layer 312 is deposited over the micro-ILEDs 302 and metal wirings 314. The OLED layers can be evaporated. The evaporation process can take place through a coarse shadow mask. The blanket cathode metal 308 is deposited to form the OLED 304. The blanket cathode metal 308 can be deposited through a coarse shadow mask.

The OLED 304 can be formed of organometallic chelates (for example, $Alq_3$), fluorescent and phosphorescent dyes, compounds such as perylene, rubrene, and quinacridone derivatives, or conjugated dendrimers. In certain embodiments, the OLED 304 is polymer light-emitting diode that utilizes an electroluminescent conductive polymer. The polymer can be poly(p-phenylene vinylene) or polyfluorene. In certain embodiments, the OLED 304 is a phosphorescent OLED.

In certain embodiments, it is advantageous for the micro assembled display to include one or more of several colors of micro assembled ILEDs, several different types of micro assembled IR or temperature sensing devices, micro assembled passive electrical components, or micro assembled control or memory elements. In certain embodiments, the number of sensing elements is less than the number of ILEDs in the display. In certain embodiments, the number of sensing elements is equal to or larger than the number of ILEDs.

Having described certain embodiments, it will now become apparent to one of skill in the art that other implementations incorporating the concepts of the disclosure can be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions can be conducted simultaneously.

What is claimed:

1. A hybrid display, comprising:
    a plurality of pixels disposed on a display substrate, each pixel comprising a first subpixel that emits a first color of light and a second subpixel that emits a second color of light different from the first color of light, wherein light from the first subpixel is emitted by an inorganic light emitter and light from the second subpixel is emitted by an organic light emitter.

2. The hybrid display of claim 1, wherein the inorganic light emitter is an inorganic light emitting diode (iLED) having a native semiconductor substrate separate and distinct from the display substrate.

3. The hybrid display of claim 1, wherein the organic light emitter is an organic light-emitting diode (OLED) disposed on the display substrate.

4. The hybrid display of claim 1, comprising a third subpixel emitting a third color of light different from the first color and different from the second color, wherein light from the third subpixel is emitted by an inorganic light emitter.

5. The hybrid display of claim 4, wherein the first subpixel is a red subpixel, the second subpixel is a green subpixel, and the third subpixel is a blue subpixel.

6. The hybrid display of claim 1, wherein the display substrate is a member selected from the group consisting of polymer, plastic, resin, polyimide, PEN, PET, metal, metal foil, glass, a semiconductor, and sapphire.

7. The hybrid display of claim 1, wherein the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

8. The hybrid display of claim 1, wherein the inorganic light emitter has at least one of a width, length, and height from 2 to 5 µm, 5 to 10 µm, 10 to 20 µm, or 20 to 50 µm.

9. The hybrid display of claim 1, wherein the area of the non-native substrate covered with ILEDs is no greater than 50%, 40%, 30%, 20%, 10%, 5%, or 3% of the display.

10. The hybrid display of claim 1, wherein each pixel comprises a integrated circuit electrically connected to each subpixel in a respective pixel.

11. The hybrid display of claim 10, wherein the integrated circuits are on the same plane as the light emitters.

12. A hybrid display, comprising:
a plurality of heterogeneous pixels disposed on a display substrate, each pixel comprising a first subpixel that emits a first color of light and a second subpixel that emits a second color of light different from the first color of light, wherein light from the first subpixel is emitted by a first light emitter and light from the second subpixel is emitted by a second light emitter having a different size than the first light emitter.

13. The hybrid display of claim 12, wherein the first light emitter is an inorganic light emitter and the second light emitter is an organic light emitter.

14. The hybrid display of claim 12, wherein the first light emitter is an inorganic light emitter and the second light emitter is an inorganic light emitter.

15. The hybrid display of claim 14, wherein the inorganic light emitters have at least one of a width, length, and height from 2 to 5 µm, 5 to 10 µm, 10 to 20 µm, or 20 to 50 µm.

16. The hybrid display of claim 12, comprising a third light emitter.

17. The hybrid display of claim 16, wherein the third light emitter has a different size than the first light emitter, a different size than the second light emitter, or a different size than the first light emitter and the second light emitter.

18. The hybrid display of claim 16, wherein the first light emitter is a red light emitter that emits red light, the second light emitter is a green light emitter that emits green light, and the third light emitter is a blue light emitter that emits blue light.

19. The hybrid display of claim 12, comprising a pixel controller for controlling the first and second light emitters and wherein the pixel controller comprises a control circuit that controls the first light emitter differently from the second light emitter.

* * * * *